United States Patent
Markovich et al.

(10) Patent No.: US 8,592,299 B1
(45) Date of Patent: Nov. 26, 2013

(54) SOLDER AND ELECTRICALLY CONDUCTIVE ADHESIVE BASED INTERCONNECTION FOR CZT CRYSTAL ATTACH

(75) Inventors: Voya R. Markovich, Endwell, NY (US);
Rabindra N. Das, Vestal, NY (US);
Rajinder S. Rai, Vestal, NY (US);
Michael Vincent, Chandler, AZ (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 13/358,716

(22) Filed: Jan. 26, 2012

(51) Int. Cl.
*H01L 21/44* (2006.01)

(52) U.S. Cl.
USPC ............................ 438/612; 438/613; 438/107

(58) Field of Classification Search
USPC ................. 438/107, 109, 122, 125, 612, 613
See application file for complete search history.

(56) References Cited

U.S. PATENT DOCUMENTS

| | | | |
|---|---|---|---|
| 6,909,100 B2 | 6/2005 | Sognefest et al. | |
| 7,223,981 B1 | 5/2007 | Capote et al. | |
| 2005/0280136 A1* | 12/2005 | Curcio et al. | 257/686 |
| 2009/0218647 A1 | 9/2009 | Smith et al. | |
| 2011/0229708 A1* | 9/2011 | Asami et al. | 428/316.6 |
| 2012/0049079 A1* | 3/2012 | Yanoff et al. | 250/370.13 |

* cited by examiner

*Primary Examiner* — Timor Karimy
(74) *Attorney, Agent, or Firm* — Mark Levy; Hinman, Howard & Kattell, LLP

(57) ABSTRACT

A structure for minimizing resistance between a semi-insulating x-ray detector crystal and an electrically conducting substrate. Electrical contact pads are disposed on the detector crystal and on the substrate with an electrical interconnect between the contact pads formed from a conductive adhesive and washed solder in electrical and mechanical communication with the pads.

8 Claims, 2 Drawing Sheets

SOLDER AND ELECTRICALLY CONDUCTIVE ADHESIVE BASED INTERCONNECTION FOR CZT CRYSTAL ATTACH

FIELD OF THE INVENTION

The present invention relates to electrical connections and, more particularly, to connections employed in a crystalline material used for the direct conversion of x-ray energy to electrical signals.

BACKGROUND OF THE INVENTION

One of the most effective materials in current use for the direct conversion of x-ray energy into an electrical signal is Cadmium Zinc Telluride (CZT). Electrodes of CZT radiation detectors are presently formed of platinum thin films. The platinum forming each electrode is deposited via a suitable thin film deposition technique such as, without limitation, sputtering, to a thickness of approximately 1000 Angstroms. However, this thickness is not to be construed in a limiting sense.

Each platinum electrode defines an electronic contact that enables the CZT bulk material to have superior performance when acting as an x-ray or gamma-ray radiation detector and to interface with electronics with sufficient connectivity to allow the data acquisition and control electronics to form a functional and high performance CZT detector based sensor.

In the case of a CZT detector based sensor system, platinum electrodes provide for the proper work function and chemical bond to the CZT bulk material so that the work function matches the bandgap, resistivity, and interface electronic properties of the CZT bulk material, thereby enabling the CZT bulk material, or other suitable compound semiconductor crystal material, to realize full depletion its entire volume with excellent collection of charge carriers generated by the absorbed x-rays and gamma rays. The high sensitivity provided by the full depletion of the entire CZT bulk material volume and the good charge collection ensures nearly loss-free signal generation from absorbed photons and provides higher performance levels of CZT based detectors than do many other semiconductor detectors.

In the manufacture of compound semiconductor devices, such as CZT detectors, the mechanical fragility of the delicate thin platinum electrode metal prohibits the use of robust manufacture methods to fabricate these devices. Specifically, after deposition, the delicate thin-film platinum electrodes are easily damaged during subsequent device fabrication steps such as: in-line probe testing; device handling during downstream device processing; and bonding to interconnect substrates or read-out electronics during integration to signal processing electronics.

After deposition on a CZT detector, platinum electrodes are soft and frequently scratched during subsequent handling and manufacture of CZT radiation detectors. Even minor scratching of these delicate platinum electrodes can cause damage to the underlying CZT-to-metal interface and can generate electronic noise in the CZT detector. At a minimum, this damage can deteriorate the performance and reduce the operative range (bias voltage, temperature) of the CZT detector. Often this damage is catastrophic and renders the CZT detector unusable for its intended application. When scratched, a CZT detector may require rework, re-metallization, or may be lost as scrap.

This crystalline material is extremely fragile. When electrical connections to the crystal are made using packaging techniques commonly applied to semiconductors, a significant shift in energy response ratios can result due to increased resistance in the interconnection between the CZT and the data acquisition and control electronics. A possible resolution of this problem is to use a low temperature, reflowed solder connection, although the solder melting/joining process may diffuse or dissolve the thin CZT electrical connection pads and thereby cause connection problems, which adversely affect the performance of the crystal.

The solder melting/joining that can diffuse or dissolve the thin CZT electrical connection pad causing crystal interconnect degradation is the problem solved by the current invention. Important features of a typical crystal detector package are used herein to describe the art as it is currently practiced. A detector crystal is attached to a substrate via a series of electrically conductive interconnections to form a detector package. In some instances an underfill material is disposed between the crystal and the substrate. Electrical traces within the substrate are in electrical communication with the electronics used to amplify and process signals generated within the crystal.

A combination of multiple heat applications and possible residual solder flux materials remaining on the attachment substrate pads contributes to degrade the contact pads located on the CZT crystal, thereby causing attachment and electrical connection issues. The resultant sub-optimal connection at this interface often produces a shift in energy response ratios by the crystal structure.

Whatever the source of degradation, the spectral performance of the crystal is degraded at low photon flux, and the linearity of the system is diminished at higher flux levels. Connection degradation must be reduced or preferably eliminated from x-ray detector crystal signal interconnect pathways. An interface is desired between the attachment substrate and the contact pads of a CZT crystal package that is mechanically robust and has low electrical resistance.

DISCUSSION OF RELATED ART

U.S. Pat. No. 7,223,981 by Capote et al., granted May 25, 2007 for GAMMA RAY DETECTOR MODULES, discloses a radiation detector assembly having a semiconductor detector array substrate of CdZnTe or CdTe, having a plurality of detector cell pads on a first surface, the pads having a contact metallization and a solder barrier metallization. An interposer card has dimensions no larger than the dimensions of the semiconductor detector array substrate, a quantity of interconnect pads on its surface with at least one readout semiconductor chip and connector on another surface, each having dimensions no larger than the dimensions of the interposer card. Solder columns extend from contacts on the interposer surface to the pads on the semiconductor detector array substrate surface, with the solder columns having at least one solder having a melting point or liquidus less than 120 degrees C. An encapsulant is placed between the interposer circuit card first surface and the semiconductor detector array substrate first surface, encapsulating the solder columns, the encapsulant curing at a temperature no greater than 120 degrees C.

U.S. Pat. No. 6,909,100 by Sognefest et al., granted Jun. 21, 2005 for RADIATION DETECTOR ASSEMBLY, discloses a semiconductor radiation detection crystal that converts incident radiation or an incident particle into an electrical signal. A first substrate for conveying the electrical signal to processing electronics is bonded to the crystal via an anisotropic conductive material sandwiched therebetween. The crystal can include an array of pixels positioned in opposition with an array of conductive pads formed on the first substrate. The anisotropic conductive material forms between each pixel and its corresponding conductive pad an electrical path, with each electrical path isolated from other electrical paths.

United States Published Patent Application No. 2009/0218647, by Smith et al, published Sep. 3, 2009 for SEMICONDUCTOR RADIATION DETECTOR WITH THIN FILM PLATINUM ALLOYED ELECTRODE, describes a compound semiconductor radiation detector that includes a body of compound semiconducting material having an electrode on at least one surface. The electrode includes a layer of a compound of a first and a second element. The first element is platinum and the second element includes at least one of the following: chromium, cobalt, gallium, germanium, indium, molybdenum, nickel, palladium, ruthenium, silicon, silver, tantalum, titanium, tungsten, vanadium, zirconium, manganese, iron, magnesium, copper, tin, or gold. The layer can further include sublayers, each of which is made from a different one of the second elements and platinum as the first element.

SUMMARY OF THE INVENTION

In accordance with the invention, there is disclosed an interconnect attach structure and assembly method that limits damage to the crystal interconnecting pad and enhances connection quality and stability between a semi-insulating x-ray detector crystal and a substrate board.

It is an object of this invention to use an electrically conducting adhesive (ECA) that improves the crystal pad to control electronics substrate pad interface.

It is another object of this invention to place solder paste on a substrate pad of the control electronics only and place ECA separately on a CZT crystal pad.

It is still another object of this invention to reflow the solder on the substrate pad of the control electronics separately and subsequently wash the solder to remove flux materials that may remain after reflow.

It is another object of this invention to use an ECA without compromising electrical conductivity between crystal and substrate.

It is another object of this invention to use an ECA containing flux component that re-melts reflowed, washed solder during ECA curing and produces a better ECA-solder connection.

It is another object of this invention to cure ECA with a reflow process.

It is yet another object of this invention to use solder paste with no clean flux which reacts with the ECA during a reflow and curing process.

It is another object of this invention to use solder paste with no clean flux, used as curing agent for the ECA.

It is another object of this invention to provide the solder height at least as great as the ECA height.

It is another object of this invention to reduce ECA joint height with respect to total joint height to reduce electrical resistance of such joint.

It is another object of this invention to use an ECA with nano and micro particles.

It is another object of this invention to allow the ECA parts of a joint to sinter and the solder parts to melt.

It is still another object of this invention to have the metal particles of the ECA react with the solder to produce an intermetallic/solid solution and thus reduce solder-ECA interface resistance.

It is another object of this invention to provide a substrate pad larger than the CZT crystal pad or vice versa.

BRIEF DESCRIPTION OF THE DRAWINGS

A complete understanding of the present invention may be obtained by reference to the accompanying drawings, when considered in conjunction with the subsequent detailed description, in which.

For the sake of clarity and brevity, like elements and components of each embodiment will bear the same designations throughout the description.

DESCRIPTION OF THE PREFERRED EMBODIMENT

It is known in the art that discontinuities due to the diffusion and/or dissolving of the thin conductive pads on a CZT crystal during solder reflow can result in detector modules showing significant shifts in energy response ratios due to the interconnection being sub-optimal. Interconnection issues in semi-insulating crystals can arise from sources that are functions of the joining materials.

Figure 1:
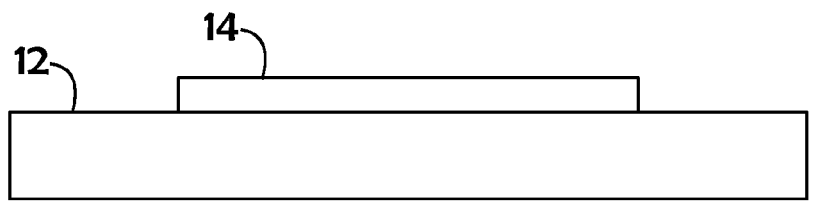
FIG. 1 is a side view of a substrate and metal coating.

Shown in FIG. 1 are features of a typical package that is used herein to describe the art as currently practiced. A substrate 12 having a connection pad 14 is typical of a detector crystal substrate assembly 20 (FIG. 3) and the joining connection substrate 17 (FIG. 2) to which it is attached, where the joined connection substrate 17 contains electronics to interpret signals received from the detector crystal 18 (FIG. 3).

Figure 2:
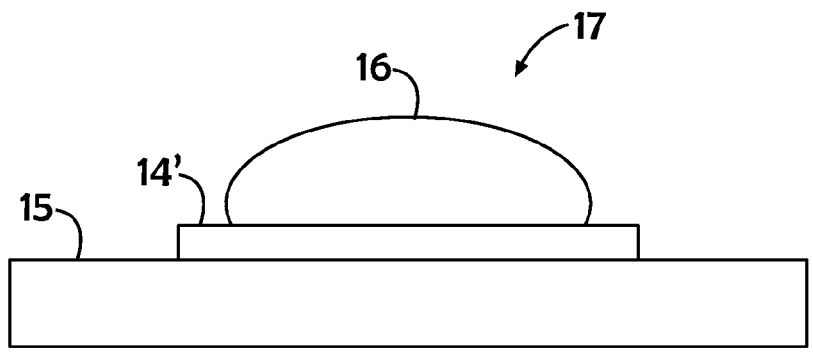
FIG. 2 is a side view of solder paste on a substrate conductive pad.

FIG. 2 shows a substrate 15 with connection pad 14' having a quantity of solder 16 deposited by screening, stenciling, flood coating, doctor blading, immersing or injecting, as known in the art. In the preferred embodiment, connection substrate 17 is separately run through the reflow process to melt the solder 16 on the pad 14'. By melting the solder 16, a subsequent process of cleaning solder 16 is performed to remove any flux or other wetting agents that remain and cause issues when this connection substrate 17 is joined with the detector crystal substrate assembly 20 (FIG. 3).

Figure 3:
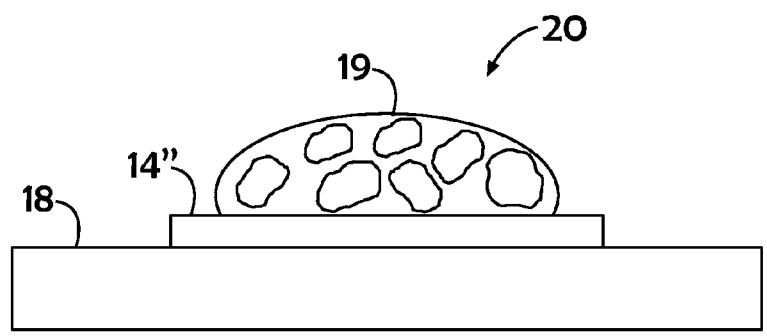
FIG. 3 is a side view of electrically conductive adhesive (ECA) on a substrate conductive pad.

FIG. 3 shows a crystal substrate 18, again with connection pad 14", having a quantity of ECA (also known as conductive paste) 19 deposited by screening, stenciling, flood coating, doctor blading, immersing or injecting, also as known in the art. ECA 19 is used on pad 14" for joining to pad 14' of connection substrate 17 using a reflow process whereby solder 16 is re-melted and ECA 19 is cured, producing an intermetallic/solid solution and forming a stable junction. Electrical traces (not shown) within the substrate 17 are in electrical communication with outboard electronics (also not shown) that are used to amplify and process signals generated within the crystal substrate 20. Connection pad 14" of CZT is commonly a Pt (platinum) electrode, but it is also possible to use Pt, Pd (palladium), Au (gold), or their mixtures. Metal deposition can be any chemical or physical deposition process. Sputter deposition, filament evaporation, and E-beam evaporations are some example of physical vapor deposition processes. The CZT connection pad can further use an electrodeless process to deposit copper, solver, nickel, gold, palladium or their mixtures to make the connection pad 14" thicker.

Figure 4:
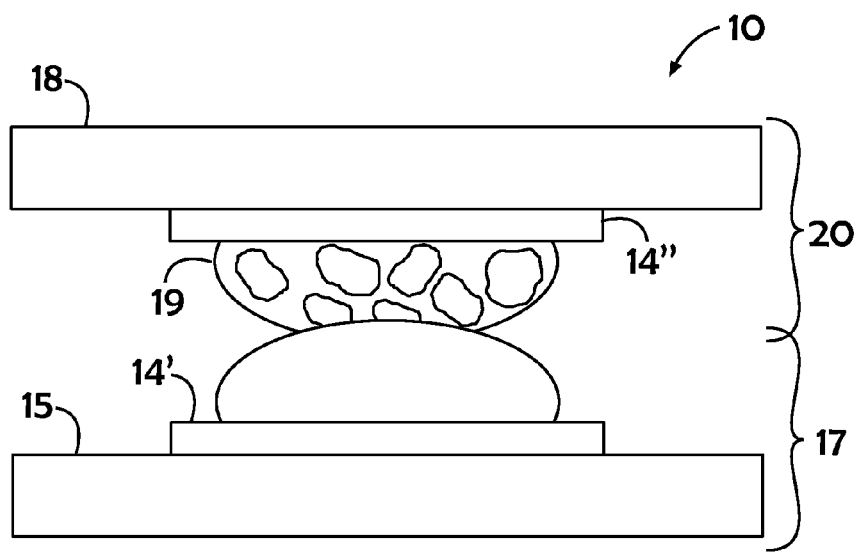
FIG. 4 is a side view of ECA and mating solder on opposing substrate conductive pads prior to reflow and curing.

FIG. 4 shows a detector assembly 10 containing crystal substrate 20 and connection substrate 17 having aligned ECA 19 and washed solder 16 prior to curing the ECA and concomitantly reflowing solder 16 to create an electrical connection between pad 14' and pad 14", thereby ensuring a solid connection and minimizing the possibility of damaging thin pad 14" attached to the CZT crystal 18.

It is also possible to use an ECA-containing flux component that re-melts solder 16 during the curing process of the ECA 19 in order to produce a better ECA-solder bonding, creating an electrical connection between pad 14' and pad 14".

It is another possibility to cure the ECA with reflow process and/or an oven heat-treatment process.

It is also possible to use un-reflowed solder paste with no clean flux that reacts with ECA during a final reflow and/or curing process and produce better ECA-solder bonding to create an electrical connection between pad 14' and pad 14". Un-reflowed solder paste with no clean flux can be used as a curing agent for the ECA 19.

Since solder height can be equal to or greater than ECA height, half or more than half of the joint can be pure solder and the rest of the portion of interconnect can be ECA. Less ECA in the total joint results in the joint being more electrically conductive. A pure ECA joint is good for reducing surface damage, but the longer electrical path makes the pure ECA joint more resistive and susceptible to thermal cycle fail. Thus, it is possible to make an electrically better hybrid joint with ECA and solder where ECA connects with the crystal surface for reducing crystal surface damage, but reduces the ECA joint thickness with respect to the total joint.

Significantly, the ECA 19 (FIGS. 3 and 4) as used in this embodiment includes a metal component including nano and or micro particles. Metals which may form the nano and or micro particles include copper, silver, gold, silver-coated copper, gold-coated copper, and alloys thereof. In one embodiment of the invention, a conductive paste having silver nanoparticles may be used. Depending on the desired sintering (and, possibly, melting) temperature(s) desired to form sound conductive paths through the paste, the conductive paste composition used herein may further include additional elements. Such elements may include micro-particles of metal (including silver), micro-particles of solder, and, in some situations, the addition of a conducting polymer and, even further, the addition of an organic material or composition. Several examples of the various compositions which may be used successfully herein are provided below.

An important aspect of this invention is that the conductive paste, once positioned with the respective connection pad, is capable of undergoing a sintering phase in which selected ones of the nano-particles will sinter, thereby forming several contiguous circuit paths through the composition. In addition to sintering, the composition may also include elements (e.g., micro-particles of solder or a metal) that will melt to form still further contiguous electrical paths for interconnects. Importantly, if these added elements are used, the melting is not to occur until at least sintering has begun and, possibly, after sintering has been achieved. The result of this of course is the formation of both electrical paths formed by sintering and melting, thereby assuring an excellently electrical conducting interconnect due to the presence of the conductive paste therein.

Suitable additional metal elements, including solder, for use in the compositions taught herein may be referred to as low melting point (LMP) metallurgies, and are mixed with the primary metal (e.g., silver or a silver-copper mixture) nanoparticles. These LMP metallurgies include tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. These secondary LMP metallurgies include melting points greater than that of the primary metal and thus melt once the primary metal has effectively sintered. Alternatively, these LMP metallurgies may begin melting during the sintering, depending on how close the LMP melting point is to the melting point of the primary metal.

The present interconnect approach can be used for any single or multi-component based single or poly crystals to attach with the substrate.

It will be appreciated that the objects of this invention—reduction of resistance in x-ray detector crystals interconnects and a manufacturable method to produce the structure—are achieved as described.

Since other modifications and changes varied to fit particular operating requirements and environments will be apparent to those skilled in the art, the invention is not considered limited to the examples chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method for mechanically and electrically joining a semi-insulating x-ray detector crystal to a circuitized substrate using hybrid electrical interconnects, each interconnect having a substantially pure solder portion nearest said substrate, a substantially pure electrically conductive adhesive (ECA) portion nearest said semi-insulating x-ray detector crystal, and a solder-ECA interface therebetween, the steps comprising:
   a) depositing an ECA onto a first set of electrically conductive pads of said semi-insulating x-ray detector crystal;
   b) depositing a solder onto a second set of electrically conductive pads of said circuitized substrate;
   c) initially reflowing said solder on said second set of electrically conductive pads;
   d) washing said reflow of said solder;
   e) aligning said first set of electrically conductive pads on said semi-insulating x-ray detector crystal with said second set of electrically conductive pads on said circuitized substrate;
   f) placing said semi-insulating x-ray detector crystal onto said circuitized substrate to combine corresponding deposits of said ECA and said solder;
   g) reflowing said solder subsequent to said placing step (f); and
   h) curing said ECA during said reflowing step (g), wherein said reflowing step (g) is performed with said ECA and without additional flux;
   i) forming an electrical bond with said first set of electrically conductive pads of said semi-insulating x-ray detector crystal, the reflowed solder of step (g) forming an electrical bond with said second set of electrically conductive pads of said circuitized substrate, and said solder and said cured ECA forming an electrical bond at the ECA-solder interface to complete a single electrical interconnect between said circuitized substrate and said semi-insulating x-ray detector crystal to form a detector assembly.

2. The method of claim 1, wherein said ECA is deposited upon said first and second sets of electrically conductive pads using a process taken from the group: screening, stenciling, flood coating, doctor blading, immersing, or injecting syringe.

3. The method of claim 1, wherein said solder is deposited upon said first and second sets of electrically conductive pads using a process taken from the group: screening, stenciling, flood coating, doctor blading, immersing, and injecting syringe.

4. The method of claim 1, wherein said reflow of solder and said curing of ECA creates an intermetallic/solid-solution.

5. The method of claim 4, wherein said intermetallic/solid-solution reduces resistance of said solder-ECA interface.

6. The method of claim 1, wherein said reflow is performed at a temperature within the expected range of temperature excursions during use of said detector assembly.

7. The method of claim 1, wherein said cure is performed at a temperature within the expected range of temperature excursions during use of said detector assembly.

8. The method of claim 1, wherein the height of said solder of said single interconnect is at least as high as said ECA thereof.

\* \* \* \* \*